United States Patent [19]

Dwyer

[11] Patent Number: 4,656,055
[45] Date of Patent: Apr. 7, 1987

[54] DOUBLE LEVEL METAL EDGE SEAL FOR A SEMICONDUCTOR DEVICE

[75] Inventor: Robert A. Dwyer, Readington Township, Hunterdon County, N.J.

[73] Assignee: RCA Corporation, Princeton, N.J.

[21] Appl. No.: 854,692

[22] Filed: Apr. 18, 1986

Related U.S. Application Data

[62] Division of Ser. No. 679,589, Dec. 7, 1984, abandoned.

[51] Int. Cl.$^4$ .................................................. H01L 21/88
[52] U.S. Cl. .................................................. 427/89; 427/85; 427/93; 427/96; 357/52; 357/53; 357/71
[58] Field of Search ............... 427/89, 85, 88, 96, 427/93

[56] References Cited

U.S. PATENT DOCUMENTS

| | | | |
|---|---|---|---|
| 4,060,827 | 11/1977 | Ono et al. | 357/52 |
| 4,124,863 | 11/1978 | Mason | 357/52 |
| 4,219,827 | 8/1980 | Kaiser | 357/68 |
| 4,364,078 | 12/1982 | Smith et al. | 357/52 |
| 4,423,548 | 1/1984 | Hulseweh | 29/591 |

FOREIGN PATENT DOCUMENTS

| | | | |
|---|---|---|---|
| 0095755 | 5/1983 | European Pat. Off. | |
| 2128025A | 4/1984 | United Kingdom | 357/71 |

Primary Examiner—John D. Smith
Assistant Examiner—V. D. Dang
Attorney, Agent, or Firm—Birgit E. Morris; Donald S. Cohen; James M. Trygg

[57] ABSTRACT

A three part edge seal for an integrated circuit semiconductor chip is disclosed. The edge seal includes two separate layers of metal one of which overlays the other in electrical contact. One of the metal layers is in ohmic contact with a highly doped region formed in the planar surface of the semiconductor body. The two metal layers serve as an electrical conductor to distribute power to various portions of the integrated circuit contained in the chip and electrically charge the highly doped region to prevent migration of ions into the active areas of the integrated circuits.

7 Claims, 2 Drawing Figures

DOUBLE LEVEL METAL EDGE SEAL FOR A SEMICONDUCTOR DEVICE

This is a division of application Ser. No. 679,589, filed Dec. 7, 1984, now abandoned.

This invention relates to integrated circuit semiconductor chips or dice having a metal edge seal formed about the periphery to prevent ion penetration into the substrate area containing the integrated circuits.

BACKGROUND OF THE INVENTION

Modern semiconductor chips containing integrated circuits are susceptible to ion contamination wherein ions penetrate the edge of the substrate and migrate into the interior of the chip. These ions interact with the integrated circuits and adversely affect their performance characteristics. Such ion penetration and migration is particularly enhanced when the device is in use due to the existance of electrical fields associated with the active components of the integrated circuits. One structure in common use to reduce ion mobility into the substrate is what is commonly called an edge seal.

Edge seals typically include a highly doped region formed in the substrate which extends completely around the periphery of the chip thereby encircling the area of the chip containing the integrated circuits. A metal layer is then formed over the doped region and in ohmic contact therewith. This two part edge seal, having a positive potential applied thereto, effectively traps mobile ions thereby preventing their continued migration into active areas of the integrated circuits.

It has been recent practice by some to utilize the metal portion of the two part edge seal as an electrical conductor to distribute power to various portions of the integrated circuits. Such use is particularly attractive when the devices to be powered in this manner are located in an area relatively close to the periphery of the chip. In large scale integration circuits the input/output devices are usually most conveniently located in this peripheral area. The output devices usually require significant amounts of power to drive external circuitry. As the power requirement of the output devices increases, the current carrying capability of the metal portion of the two part edge seal becomes a limiting factor.

Since the metal portion of the two part edge seal is formed concurrently with the other metalized conductors of the device, its thickness is necessarily limited to that of these other conductors. In order to increase the current carrying capacity of the edge seal, the metal portion is usually made wider. While this increases current carrying capacity, it also requires that the chip be made larger or the area reserved for integrated circuits be made smaller. Both of these results are undesirable for obvious reasons. What is needed is a structure wherein the current carrying capacity of the metal portion of the two part edge seal is significantly increased while preserving the physical size of the chip and associated integrated circuits.

SUMMARY OF THE INVENTION

The present invention provides a method of making an edge seal for trapping mobile ions in a semiconductor chip including a semiconductor body containing an integrated circuit. The body has a major surface comprising a central portion and a peripheral portion completely surrounding the central portion. The integrated circuit is disposed in a region of the body directly under the central portion. The method comprises the following steps:

(a) Forming a highly doped region in the body extending downwardly from only the peripheral portion of the surface. The doped region completely surrounds and is spaced from the region containing the integrated circuit.

(b) Forming a layer of insulating material on the central portion of the surface and on only adjacent parts of the peripheral portion.

(c) Forming a first metal layer on another part of the peripheral portion in ohmic contact with part of the highly doped region. The first metal layer completely surrounds the central portion and is in electrical contact with the integrated circuit.

(d) Forming a second metal layer substantially only on the first metal layer and in both substantial registry and electrical contact therewith.

DESCRIPTION OF THE PREFERRED EMBODIMENT

Figure 2:
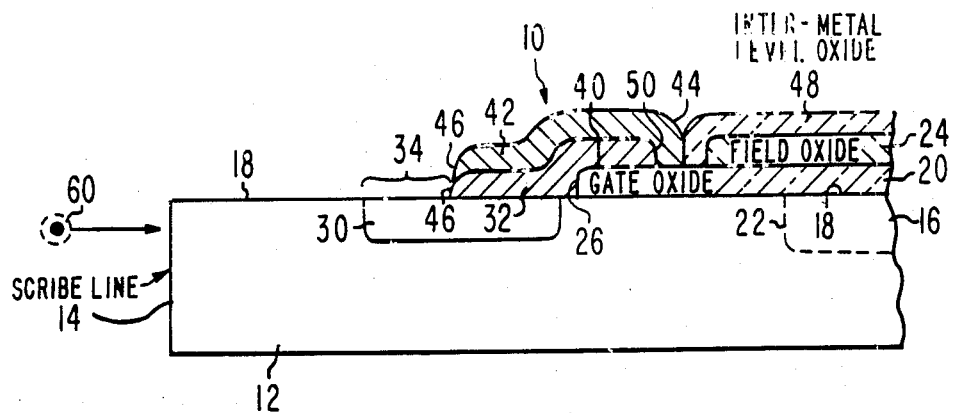
FIG. 2 is a partial cross sectional view taken along the lines 2—2 of FIG. 1.
Figure 1:
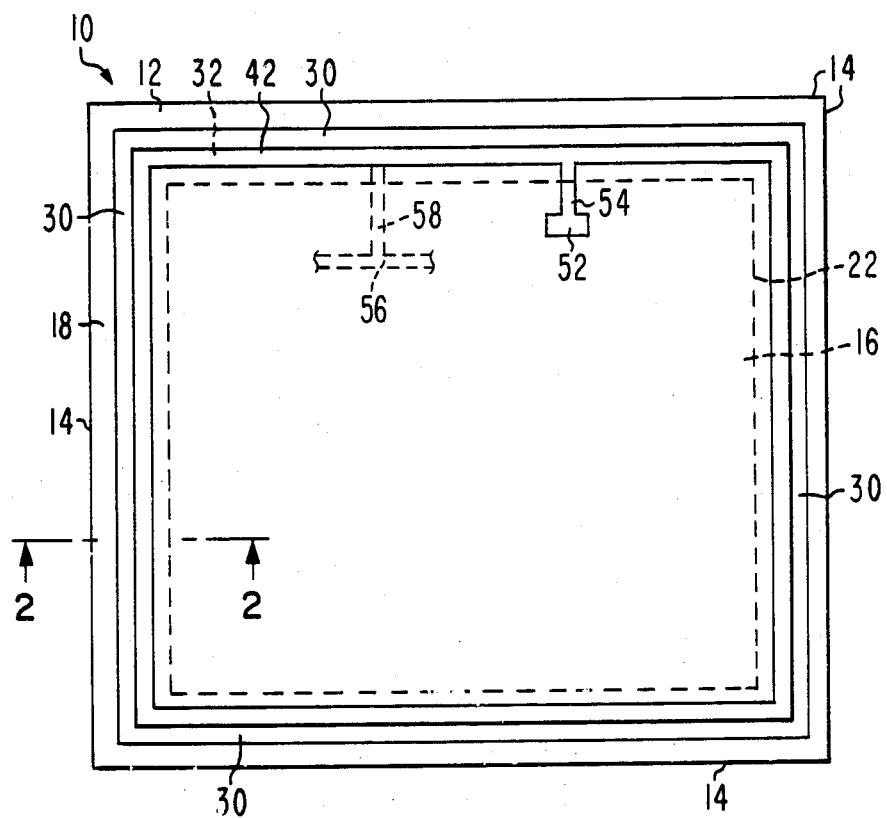
FIG. 1 is a plan view of a semiconductor device showing an embodiment of the teachings of the present invention.

There is shown in FIGS. 1 and 2 a semiconductor chip or die 10 having a body 12 of semiconducting material. The chip 10 has an outer edge 14 which corresponds to the scribe line that is commonly used in its manufacture. During manufacturing, the wafer is scribed by a diamond point or a laser thereby defining the individual chip 10. The wafer is then subjected to a bending action which causes the wafer to fracture and separate along the scribe lines into individual chips 10 having edges 14. The scribing and fracturing operations are well known in the art and, therefore, will not be described further. It will be understood, however, that the edges 14 of the body 12 typically are of raw silicon having no protective layer.

The chip 10 includes a region 16 formed in the body 12, as indicated by the dashed lines in FIGS. 1 and 2, which extends downwardly from a planar surface 18. This region 16 contains a plurality of devices that constitute the integrated circuit, bond pads for attaching lead frame wires, and metalized conductors for electrically connecting selected points of the integrated circuit to the bond pads. These devices, bond pads, and conductors, which are not shown, are completely contained within the region 16. A layer 20 of gate oxide, which forms the dielectric under the gates of the MOS transistors contained within the region 16, is disposed on the planar surface 18 and extends beyond the outer periphery 22 of the region 16 in all directions. A layer 24 of field oxide, which forms an electrically insulating layer over the devices contained within the region 16 in a manner well known in the art, is disposed over the layer 20 and extends beyond the outer periphery 22 of the region 16 in all directions, however, it terminates just short of the edge 26 of the layer 20 as shown in FIG. 2.

A highly doped region 30 preferably of N type conductivity is formed in the body 12 and extends downwardly from the planar surface 18. The region 30 completely encircles the region 16, as best seen in FIG. 1, but is spaced apart therefrom as shown in FIG. 2. A first metal layer 32 is formed on and in ohmic contact with the doped region 30. The first metal layer 32, like the doped region 30, completely encircles the region 16 and is in ohmic contact with the doped region 30 for its entire length. An outer portion 34 of the doped region 30, not being covered by the first metal layer 32, is exposed on all sides as seen in FIG. 1. This first metal layer 32 is formed concurrently with the first level metal conductors, not shown, which interconnect portions of the integrated circuit and bond pads contained within the region 16. The layer 32 and the first level metal conductors, having been formed concurrently, necessarily are substantially the same thickness. The formation of these first level metal conductors is well known in the art and therefore will not be described here. As shown in FIG. 2, the first metal layer 32 extends over the edge 40 of the gate oxide 20 in a manner well known in the art.

In the standard process of manufacturing the chip 10, a layer 40 of inter-metal level oxide is formed over the entire region 16 and extends outwardly therefrom. The layer 48, however, terminates just short of the edge 50 of the first metal layer 32 rather than continuing thereover as with prior art devices.

A second metal layer 42 is formed on and in electrical contact with the first metal layer 32. The second metal layer 42 extends over the first metal layer 32 a small amount at 44, and abuts the oxide layer 48, but otherwise, is in substantial registry therewith. That is, the outer edges 46 of the two metal layers are in substantial vertical alignment. The second metal layer 42 is formed concurrently with the second level metal conductors, not shown, which interconnect portions of the integrated circuit and bond pads contained within the region 16. The layer 42 and the second level metal conductors, having been formed concurrently, necessarily are substantially the same thickness, however, the combined thickness of the layers 32 and 42 is substantially greater than the thickness of either the first or second level metal conductors. As with the first level metal conductors, the second level conductors are formed in a manner that is well known in the art.

As shown in FIG. 1, a bond pad 52 is disposed on the surface 18 within the region 16 and is electrically connected to the first and second metal layers 32 and 42 by a metal conductor 54. Additionally, the first and second metal layers 32 and 42 are electrically connected to a first level conductor 56 by another metal conductor 58. The bond pad 52 and metal conductors 54 and 58 are formed concurrently with the first and second metal layers 32 and 42 in a manner that is well known in the art. While in the present case, the conductor 58 connects to a first level conductor 56, it may alternatively connect to a second level conductor, not shown. The purpose of the conductor 58 is to connect the first and second metal layers 32 and 42 to various portions of the integrated circuit which require power.

During operation of the chip an external power source is connected to the bond pad 52 in the usual manner. Power is thereby distributed via the conductor 54 throughout the entire length of the first and second metal layers 32 and 42 which in turn distribute power to various portions of the integrated circuit via conductors 58.

The doped region 30, the first metal layer 32, and the second metal layer 42 comprise a three part edge seal for the chip 10. As will be appreciated by those skilled in the art, the three part edge seal described above will operate to trap negative ions 60 which penetrate the body 12 through the edge 14. The operation of the three part edge seal is similar to that of the two part edge seal of the prior art.

A very important advantage of the three part edge seal of the present invention is that the two metal layers 32 and 42 have a current carrying capacity approximately twice that of the two part edge seal thereby enabling the three part edge seal to meet additional power requirements of the input/output devices located in the region 16. Further, the three part edge seal may be fabricated in substantially the same amount of surface space on the chip 10 as a two part seal thereby maintaining the original physical dimensions of the chip. Additionally, the three part edge seal requires no changes in the standard fabrication processes used for double metalization devices.

It will be understood that the above description is not intended to set forth all of the procedures and steps necessary to fabricate large scale integration semiconductor chips. Such procedures and steps are well known in the art and are considered not to be pertinent to the teaching of a three part edge seal as disclosed herein. Therefore, the device structure depicted in the drawings show only those structural features that are directly related to the invention.

I claim:

1. A method of making an edge seal for trapping mobile ions in a semiconductor chip including a semiconductor body containing an integrated circuit, said body having a major surface comprising a central portion and a peripheral portion completely surrounding said central portion, said integrated circuit being in a region of said body directly under said central portion, comprising the steps of:
   (a) forming a highly doped region in said body extending downwardly from only said peripheral portion of said surface, said region completely surrounding and being spaced from said region containing said integrated circuit;
   (b) forming a layer of insulating material on said central portion of said surface and on only an adjacent part of said peripheral portion of said surface;
   (c) forming a first metal layer on another part of said peripheral portion of said surface in ohmic contact with part of said highly doped region, completely surrounding said central portion, and in electrical contact with said integrated circuit;
   (d) forming a second metal layer only on and in both substantial registry and electrical contact with said first metal layer.

2. The method of claim 1 wherein said forming said first metal layer is concurrent with the forming of first level metal conductors which interconnect portions of said integrated circuit.

3. The method of claim 2 wherein step (c) includes forming said first metal layer so that it overlaps said layer of insulating material.

4. The method of claim 3 wherein step (c) includes forming said first metal layer so that a portion thereof is in said ohmic contact with said highly doped region for substantially the entire length of said first metal layer.

5. The method of claim 4 wherein said forming said second metal layer is concurrent with the forming of second level metal conductors which interconnect other portions of said integrated circuit.

6. The method of claim 5 including the step of forming at least one bond pad electrically connected to one of said first and second metal layers.

7. The method of claim 6 wherein said step of forming at least one bond pad includes forming said bond pad on said central portion of said surface.

* * * * *